(12) United States Patent
Wynn et al.

(10) Patent No.: US 10,895,615 B2
(45) Date of Patent: Jan. 19, 2021

(54) BALUN FOR USE IN MAGNETIC RESONANCE IMAGING (MRI) SYSTEMS AND AN MRI SYSTEM THAT EMPLOYS THE BALUN

(71) Applicant: KONINKLIJKE PHILIPS N.V., Eindhoven (NL)

(72) Inventors: Tracy Wynn, Gainsville, FL (US); Aasrith Ganti, Gainsville, FL (US); Olli Tapio Friman, Gainsville, FL (US); Christopher Spencer, Gainsville, FL (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/343,460

(22) PCT Filed: Oct. 18, 2017

(86) PCT No.: PCT/EP2017/076548
§ 371 (c)(1),
(2) Date: Apr. 19, 2019

(87) PCT Pub. No.: WO2018/077679
PCT Pub. Date: May 3, 2018

(65) Prior Publication Data
US 2019/0265316 A1 Aug. 29, 2019

Related U.S. Application Data

(60) Provisional application No. 62/411,822, filed on Oct. 24, 2016.

(51) Int. Cl.
*G01R 33/36* (2006.01)
*G01R 33/3415* (2006.01)
*G01R 33/34* (2006.01)

(52) U.S. Cl.
CPC ..... *G01R 33/3685* (2013.01); *G01R 33/3415* (2013.01); *G01R 33/34092* (2013.01)

(58) Field of Classification Search
CPC ............ G01R 33/3685; G01R 33/3415; G01R 33/34092
See application file for complete search history.

(56) References Cited

U.S. PATENT DOCUMENTS

| 4,682,125 A | 7/1987 | Harrison et al. |
| 2003/0094950 A1 | 5/2003 | Burl et al. |
| (Continued) | | |

OTHER PUBLICATIONS

J Thomas Vaughan et al: "25.5.2 Application of Cable Traps to Suppress the Common Mode" In: "RF Coils for MRI", Dec. 19, 2012 (Dec. 19, 2012), John Wiley & Sons,Incorporated, XP055445784,ISBN:978-0-470-77076-4 pp. 320-321.

(Continued)

*Primary Examiner* — Gregory H Curran

(57) ABSTRACT

A balun is provided that is suitable for use with miniature coaxial cables and that obviates the need to cut the cable in order to install the balun. A portion of each coaxial cable that extends from the RF receive coils to the RF receiver is wound multiple times around a device to form an inductor. The inductor may be used with or without a separate resonant circuit. If used with a separate resonant circuit, the inductor and the resonant circuit couple with one another to generate a coupled impedance that provides common-mode noise suppression at the frequency of interest. If used without a separate resonant circuit, the inductor formed in the cable provides an inductance and the capacitance between the windings coupled with the inductance provides a series impedance that suppresses common-mode noise at the frequency of interest.

18 Claims, 4 Drawing Sheets

(56) References Cited

U.S. PATENT DOCUMENTS

| | | | |
|---|---|---|---|
| 2008/0262584 A1* | 10/2008 | Bottomley | B29C 33/126 |
| | | | 607/119 |
| 2010/0174348 A1* | 7/2010 | Bulkes | A61N 1/05 |
| | | | 607/116 |
| 2010/0253454 A1 | 10/2010 | Schilling et al. | |
| 2011/0267062 A1 | 11/2011 | Otake et al. | |
| 2012/0074944 A1 | 3/2012 | Leussler | |
| 2012/0262177 A1 | 10/2012 | Eiermann et al. | |
| 2013/0181716 A1 | 7/2013 | Greim | |
| 2013/0285760 A1 | 10/2013 | Liu et al. | |
| 2015/0008926 A1 | 1/2015 | Yang et al. | |
| 2015/0241529 A1* | 8/2015 | Loew | G01R 33/341 |
| | | | 324/322 |

OTHER PUBLICATIONS

International Search Report and Written Opinion dated Feb. 2, 2018.

* cited by examiner

BALUN FOR USE IN MAGNETIC RESONANCE IMAGING (MRI) SYSTEMS AND AN MRI SYSTEM THAT EMPLOYS THE BALUN

CROSS REFERENCE TO RELATED APPLICATIONS

This application is a U.S. national phase application of International Application No. PCT/EP2017/076548 filed on Oct. 18, 2017, which claims the benefit of U.S. Provisional Application Ser. No. 62/411,822 filed on Oct. 24, 2016 and is incorporated herein by reference.

BACKGROUND

MRI is an imaging technology that allows cross-sectional viewing of objects, such as those found in a human body, with unprecedented tissue contrast. MRI is based on the principles of nuclear magnetic resonance (NMR), namely, that atomic nuclei with non-zero spin have a magnetic moment. In medical imaging, it is usually the nuclei of hydrogen atoms, which are present in the human body in high concentrations. Radio frequency (RF) waves are directed at the nuclei in strong external magnetic fields, leading to an excitation of the protons and a relaxing of the protons. Relaxation of the protons, results in RF signals being emitted by the nuclei that can be detected and processed to form an image.

A typical MRI system generally includes a magnet, such as a superconducting electromagnet, for example, that produces a static magnetic field, gradient coils that produce linear variations in the static magnetic field, radio frequency (RF) transmit coils that produce the RF waves that excite the nuclei of the hydrogen atoms, and RF receive coils that detect the RF electromagnetic radiation emitted by the relaxing protons of the nuclei. Typically multiple transmit coils and multiple RF receive coils are used in state-of-the-art MRI systems. Coaxial cables are used in MRI systems for the controlled transmission of RF signals within the coils. A coaxial cable has an outer shield and an inner conductor that are separated from one another by a dielectric material. The outer shield is grounded and the inner conductor is used to carry electrical current. The outer shield protects the inner conductor from picking up undesired frequencies. For this reason, coaxial cables are widely used in MRI systems for interconnecting the RF coils, for interconnecting the RF transmitter to the RF transmit coils and for interconnecting the RF receiver to the RF receive coils.

However, sources external to the cable can induce unintended electrical currents in the outer shield. The flow of these unintended currents in the outer shield, typically referred to as common mode noise, can generate unintended magnetic fields. In this way, common mode noise can reduce the shielding effect provided by the outer shield, thereby making the cable susceptible to other types of noise, which can degrade the performance of the MRI system. For these reasons, balance/unbalance circuits (baluns) are typically used with coaxial cables in MRI systems to suppress common mode noise. A variety of balun designs are used for this purpose.

In state-of-the-art MRI systems, efforts are continuously being made to increase the number of RF receive coils that are used in order to increase the speed of image acquisition. In such systems, it is not uncommon to have anywhere from eight to sixty-four RF receive coils. Each of these RF receive coils is typically connected by a coaxial cable to an RF receiver that samples and digitizes the received RF signal. Due to these increases in RF channel count, MRI system designers are under continuous pressure to reduce the sizes of components and sub-assemblies that are employed with the RF receive coils. The physical dimensions of coaxial cables currently used as state-of-the-art MRI systems places a lower limit on balun size, yielding a result that is too large for newer, denser RF coil arrays. Ultra-thin coaxial cable (diameter less than one millimeter) has been in existence for a number of years and has seen extensive use in the medical industry, particularly in ultrasound imaging systems. In medical fields in which ultra-thin coaxial cables are used, baluns can be made very small through the use of very small ferromagnetic elements, such as ferrite beads, which cannot be used MRI systems due to the large magnetic fields that are produced.

The smallest baluns in current use in MRI systems require that the coaxial cable be cut and the balun inserted between the cut ends. Cutting the cables and installing the baluns between the cut ends is a tedious process that increases installation time and difficulty. Additionally, as the sizes of the cables become smaller, special tools have to be used to cut the cables and they are not always successful. Baluns currently in use that do not require the cable to be cut are too large for most, if not all, applications where there MRI system has a high RF channel count.

Accordingly, a need exists for an effective balun that is suitable for use with miniature coaxial cables, that does not require cutting of the cable, and that is small enough in size to be used in MRI systems that have a high RF channel count.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
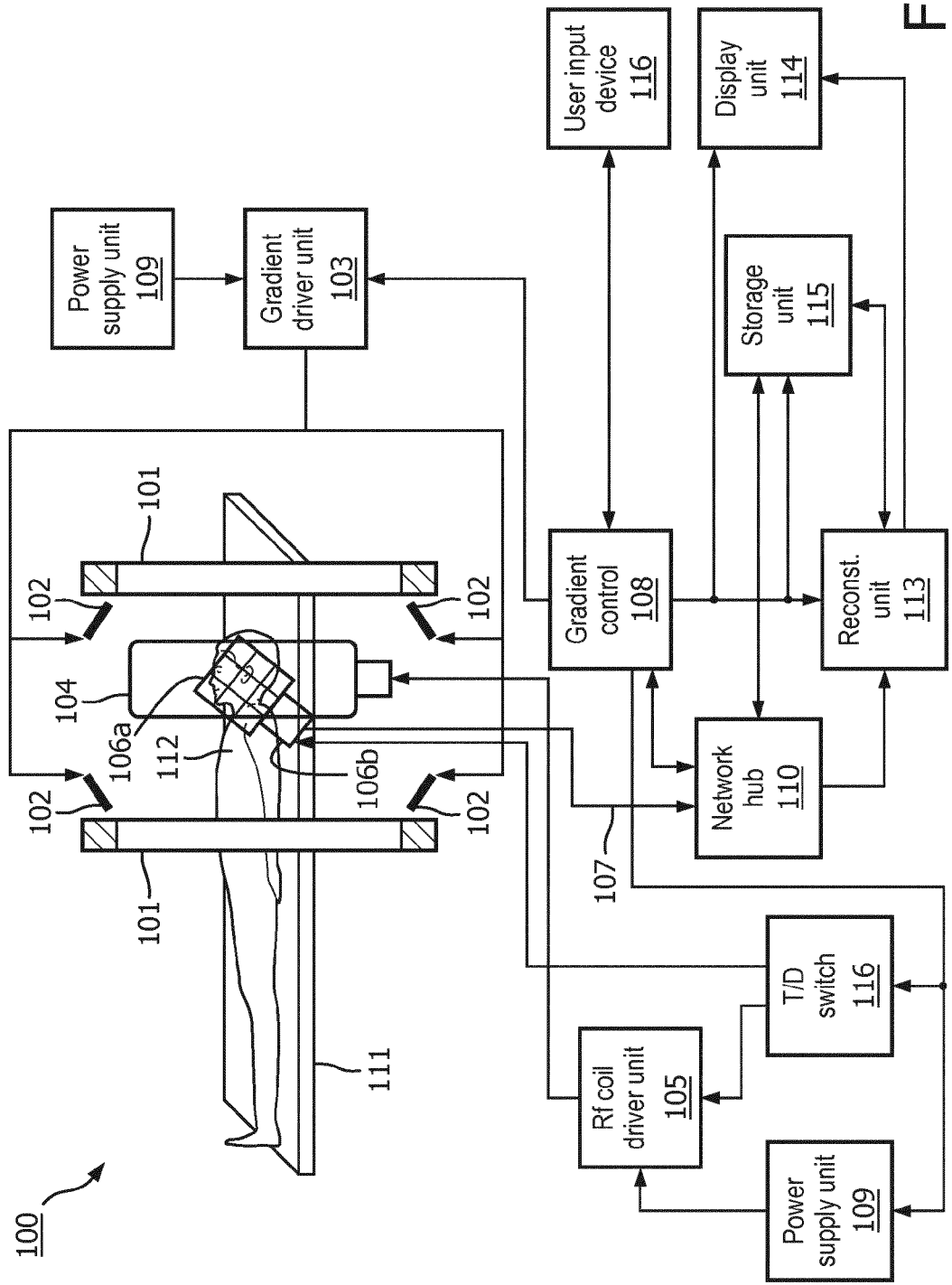
FIG. 1 illustrates a block diagram of an MRI system in accordance with an illustrative embodiment that can incorporate the baluns described herein.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to with acceptable limits or degree. For example, "substantially cancelled" means that one skilled in the art would consider the cancellation to be acceptable.

As used in the specification and the appended claims and in addition to its ordinary meaning, the terms "approximately" or "about" mean to within an acceptable limit or amount to one having ordinary skill in the art. For example, "approximately the same" means that one of ordinary skill in the art would consider the items being compared to be the same.

In accordance with representative embodiments described herein, an effective balun is provided that is suitable for use with miniature coaxial cables (i.e., less than 1 mm in diameter), that does not require cutting of the cable in order to install the balun, and that is small enough in size to be used in MRI systems that have a high RF channel count. A portion of each coaxial cable that extends from the RF receive coils to the RF receiver of the MRI system is wound multiple times around a device to form an inductor. The inductor may be used with or without a separate resonant circuit. If the balun includes a separate resonant circuit, the inductor formed in the portion of the cable and the resonant circuit couple with one another to generate a coupled impedance having a high value at the frequency of interest that suppresses common-mode noise in the cable. If the balun does not include a separate resonant circuit, the inductor formed in the portion of the cable provides an inductance and the parasitic capacitance between the windings couples with the inductance to form a parallel impedance in the cable that suppresses common-mode noise at the frequency of interest. A few representative embodiments will now be described with reference to the figures.

FIG. 1 illustrates a block diagram of an MRI system 100 in accordance with an illustrative embodiment that can incorporate the baluns described herein. The MRI system 100 comprises a set of main coils 101, multiple gradient coils 102 connected to a gradient driver unit 103 comprising a gradient amplifier (not shown) and a gradient control unit 108, and an RF coil system 104 comprising RF transmit coils (not shown) connected to an RF coil driver unit 105 and RF receive coils 106a connected to an RF receiver 106b. In accordance with this representative embodiment, the receive coils 106a are connected to the RF receiver 106b by respective miniature coaxial cables that are equipped with baluns in accordance with the present teachings, which will be described below in more detail.

The receive coils 106a acquire MR signals from at least a portion of a region excited by the RF transmit coils of the RF coil system 104. The RF receiver 106b includes RF receiver circuitry (e.g., tuning, demodulation and amplification circuitry) for detecting and recovering the MR signal and analog-to-digital conversion (ADC) circuitry for converting the MR signals into digital signals. The digitized MR signals are transferred over a communications link 107 from the RF receiver 106b to a network hub 110.

The gradient coil driver unit 103 and the RF coil driver unit 105 are powered by a power supply unit 109. A transport system 111, such as, for example, a patient table, is used to position a subject 112, such as, for example, a patient, within the MRI system 100. The network hub 110 includes a control and data acquisition system (not shown) that controls the operations of the MRI system. A reconstruction unit 113 receives MR data from the network hub 110 and reconstructs the final MRI image. A display unit 114 such as a monitor screen or a projector, for example, displays the reconstructed image. A storage unit 115 stores data and computer instructions. A user input device 116, such as, for example, a keyboard, a mouse, a trackball, etc., allows a user to operate the MRI system 100.

The main coils 101 generate a steady and uniform static magnetic field. The main coils 101 are arranged in such a way that they typically enclose a tunnel-shaped examination space (not shown), into which the subject 112 may be introduced. Another common configuration comprises opposing pole faces with an air gap in between them into which the subject 112 may be introduced by using the transport system 111. To enable MR imaging, temporally variable magnetic field gradients superimposed on the static magnetic field are generated by the multiple gradient coils 102 in response to currents supplied by the gradient driver unit 103. The power supply unit 109 supplies currents to the multiple gradient coils 102, as a result of which gradient pulses (also called gradient pulse waveforms) are generated.

The gradient control unit 108 controls the characteristics of the currents, notably their strength, duration and direction, flowing through the gradient coils 102 to create the appropriate gradient waveforms. The RF transmit coil of the RF coil system 104 generate RF excitation pulses in the subject 112, while the RF receive coils 106a receive MR signals generated by the subject 112 in response to the RF excitation pulses. The RF coil driver unit 105 supplies current to the RF transmit coil elements of the RF coil system 104 to cause the RF transmit coils to transmit the RF excitation pulses.

The characteristics of the transmitted RF excitation pulses, notably their strength and duration, are controlled by the control and data acquisition system of the network hub 110. The RF transmit coils of the RF coil system 104 are typically operated in one of two modes, namely transmit and detune modes, by the control and data acquisition system via a T/D switch 116. The T/D switch 116 is provided with electronic circuitry that switches the RF transmit coils between the two modes and prevents the RF transmit coils from coupling noise during signal acquisition by the RF receive coils 106a. The T/D switch 116 also switches the RF receive coils 106a between two modes during operation, namely, between receive mode and detune or decoupling mode. The RF receive coils 106a are switched to decoupling mode during the transmit mode of the RF transmit coils and to receive mode during the decoupling mode of the RF transmit coils. The switching between the two modes of both the RF transmit and receive coils is coordinated by the control and data acquisition system of the network hub 110, typically under control of software and/or firmware being executed by one or more processors of the control and data acquisition system.

Figure 2:
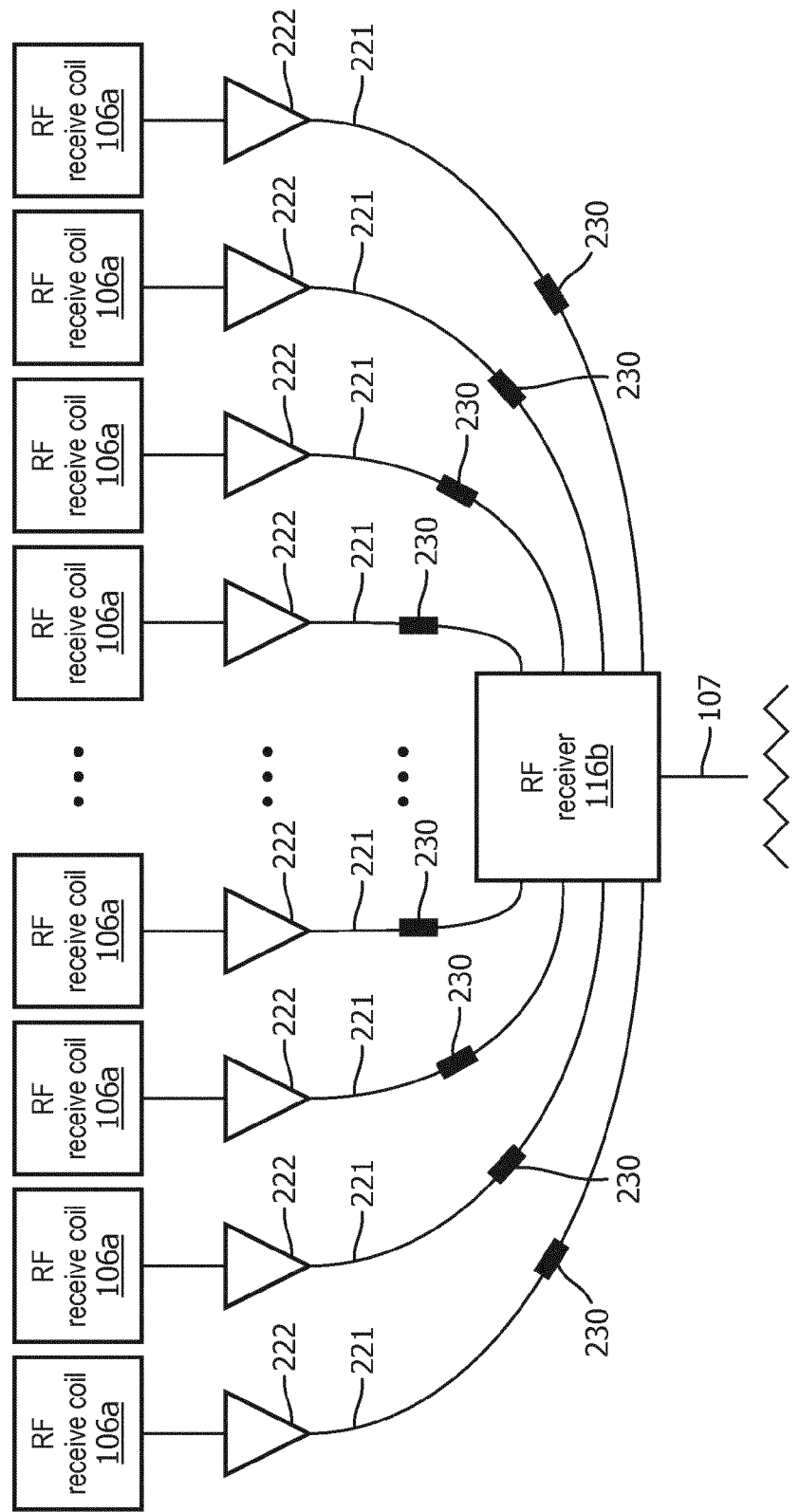
FIG. 2 illustrates a block diagram of N RF receive coils interconnected with an RF receiver by N coaxial cables, each having a balun in accordance with the present teachings, where N is a positive integer that is greater than or equal to 1.

Having described an example of an MRI system in which the baluns in accordance with the present teachings may be employed, representative embodiments of the baluns will now be described. FIG. 2 illustrates a block diagram of N RF receive coils 106a interconnected with an RF receiver 106b by N coaxial cables 221, each having a balun 230 in accordance with the present teachings disposed between first ends and second ends of the coaxial cables 221, where N is a positive integer that is greater than or equal to 1. Typically N is greater than 1 and ranges from 8 to 64. Each RF receive coil 106a detects an RF signal and generates an analog electrical MR signal. The outputs of the RF receive coils 106a are connected to respective amplifiers 222 that amplify the respective MR signals output by the respective RF receive coils 106a and output respective amplified analog MR signals onto respective coaxial cables 221. Each coaxial cable 221 is equipped with a balun 230 that removes common mode noise from the respective coaxial cable 221. As will be described below in more detail with reference to FIGS. 3-5, each balun 230 includes an inductor formed from multiple turns of the respective cable 221 about a device made of a dielectric material. Thus, the baluns 230 are coupled to the respective cables 221 without having to cut the cables 221. The baluns 230 are designed to have a resonant frequency that is equal to a frequency of interest of the RF receive coils 106a such that the baluns 230 exhibit high impedance at the resonant frequency that suppresses common-mode noise.

Figure 3:
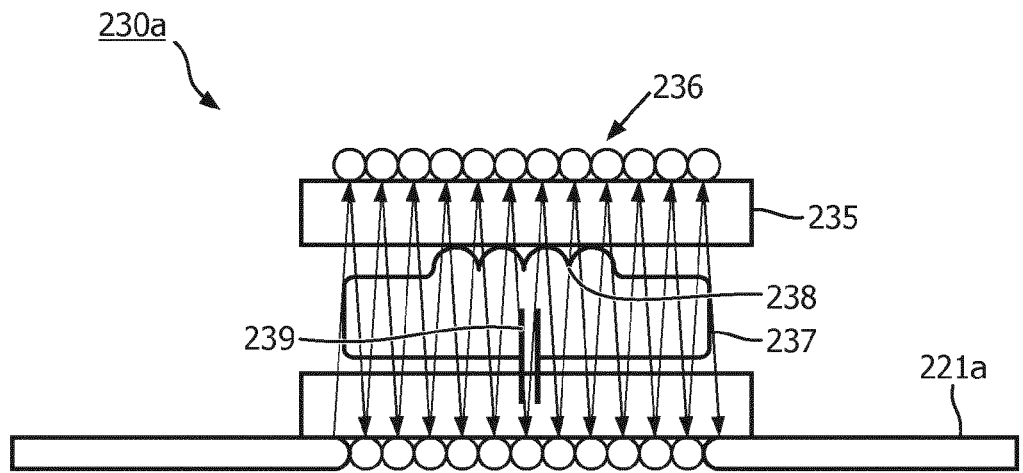
FIG. 3 illustrates a cross-sectional block diagram of a balun in accordance with a first representative embodiment.

The balun 230 can have various configurations, a few of which will now be described with reference to FIGS. 3-5. FIG. 3 illustrates a cross-sectional block diagram of a balun 230a in accordance with a first representative embodiment. In FIG. 3, one of the coaxial cables 221a shown in FIG. 2 is shown wound about an outer surface of a device 235 to form an inductor 236 in the cable 221a. The direction of the windings, or turns, of the inductor 236 is represented by the arrows in FIG. 3. A resonant circuit 237 disposed inside of the device 235 is magnetically coupled to the inductor 236 of the cable 221a. In accordance with this embodiment, the device 235 is at least partially hollow to receive the resonant circuit 237 therein. The device 235 is a made of a dielectric material, such as a solid plastic material. The resonant circuit 237 is represented in block diagram form by an inductor 238 electrically coupled in parallel with capacitor 239. The resonant circuit 237 can have a variety of circuit configurations, but should be very small in size in order to meet one of the goals of the present teachings of utilizing space efficiently in the MRI system 100. Persons skilled in the art will understand how to configure a resonant circuit 237 that is sufficiently small in size to meet this goal in view of the teachings provided herein.

The target resonant frequency of the resonant circuit 237 can be achieved by adjusting the inductance and/or the capacitance of the resonant circuit 237 and/or by adjusting the number, L, of turns of the inductor 236 formed of the windings of the cable 221a, where L is a positive integer that is greater than or equal to 1. The coaxial cable 221a has a diameter that is typically less than or equal to 1.0 mm. Because of the small diameter of the cable 221a, the inductor 236 can have a large number of turns within a small area, which results in the inductor 236 having a very large inductance. When the large inductance of the inductor 236 couples magnetic fields created by common-mode currents in the cable 221a into the parallel resonant circuit 237, a large series impedance to common-mode signals is created, which provides common-mode suppression for common-mode signals propagating in the cable 221. Thus, the balun 230a is capable of providing effective common-mode noise suppression within a very small area, and without having to cut the cable 221a in order to install the balun 230a. The target resonant frequency of the resonant circuit 237 is achieved by adjusting the inductance and/or the capacitance of the resonant circuit 237 and/or by adjusting the number of turns of the inductor 236 formed of the windings of the cable 221b.

Figure 4:
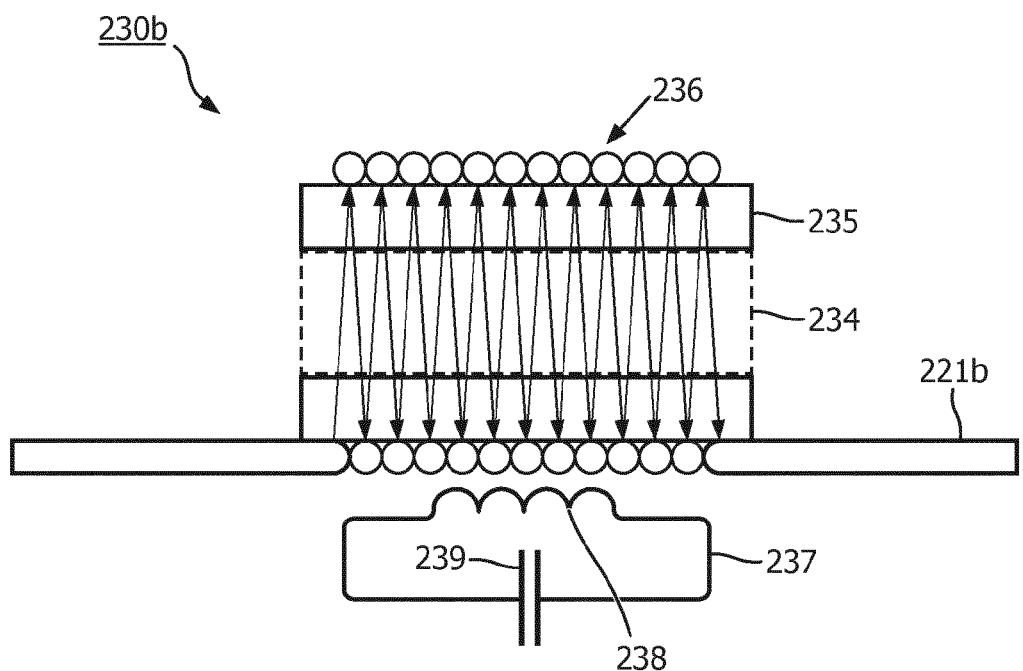
FIG. 4 illustrates a cross-sectional block diagram of a balun in accordance with another representative embodiment.

FIG. 4 illustrates a cross-sectional block diagram of a balun 230b in accordance with another representative embodiment. The balun 230b is identical to the balun 230a shown in FIG. 3 except that the resonant circuit 237 shown in FIG. 4 is external to the device 235 and to the inductor 236. In FIG. 4, one of the coaxial cables 221b shown in FIG. 2 is wound L times about the outer surface of the device 235 to form the inductor 236 in the cable 221b, where L is a positive integer that is greater than or equal to 1. The direction of the windings, or turns, of the inductor 236 is represented by the arrows in FIG. 4. The resonant circuit 237 is disposed proximate, but external to, the inductor 236.

The balun 230b operates in the same way that the balun 230a operates, as described above with reference to FIG. 3. The target resonant frequency of the resonant circuit 237 is achieved by adjusting the inductance and/or the capacitance of the resonant circuit 237 and/or by adjusting the number of turns of the inductor 236 formed of the windings of the cable 221b. In addition, an optional diamagnetic slug 234 can be installed inside of and is at least partially contained in the device 235 to alter the magnetic susceptibility of the cable 221b in the region of the inductor 236. The diamagnetic material of which the slug 234 is made may be, for example, aluminum or copper.

At the target frequency of interest, the inductor 236 couples magnetic fields created by common-mode currents flowing in the cable 221b into the parallel resonant circuit 237, creating a large series impedance to common-mode signals, which results in common-mode noise suppression. Thus, the balun 230b is capable of providing effective common-mode noise suppression within a very small area and without having to cut the cable 221b in order to install the balun 230b.

Figure 5:
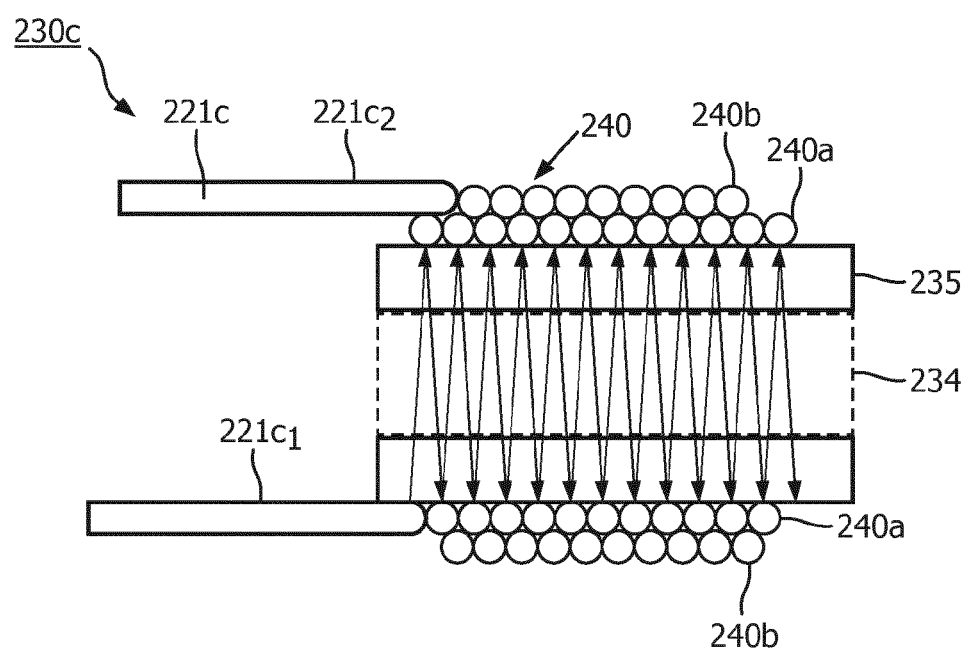
FIG. 5 illustrates a cross-sectional block diagram of a balun in accordance with another representative embodiment.

FIG. 5 illustrates a cross-sectional block diagram of a balun 230c in accordance with another representative embodiment. In FIG. 5, one of the coaxial cables 221c shown in FIG. 2 is wound about the outer surface of the device 235 L times, where L is a positive integer that is greater than or equal to 1, in M layers, where M is a positive integer that is greater than or equal to 1, to form an inductor 240 in the cable 221c. The direction of the windings, or turns, of the inductor 240 is represented by the arrows in FIG. 5. In accordance with the representative embodiment shown in FIG. 5, L is greater than 2 and M is equal to 2. The inductor 240 is formed as follows: starting with portion $221c_1$ of the cable 221c, the cable 221c is wound from left to right about the device 235 looking at the drawing page to form a first inductor layer 240a of the inductor 240; then, starting with portion $221c_2$, the cable 221c is wound from right to left about the device 235 on top of the first inductor layer 240a to form a second inductor layer 240b of the inductor 240.

In accordance with this embodiment, the balun does not include the resonant circuit 237 shown in FIGS. 3 and 4. There is a parasitic capacitance between the windings of the inductor 240. The number, L, of windings and the number, M, of layers of the inductor 240 are chosen in such a way that the inductance provided by the inductor in combination with the capacitance between the windings of the inductor 240 provides an LC resonant circuit that is self-resonant at the target frequency of interest. The inductance coupled with the capacitance provides a parallel impedance at the target frequency of interest, which, in turn, suppresses common-mode noise in the cable 221c. The target frequency of interest is achieved by adjusting the number of turns of the inductor 240 and/or the number of layers that the inductor 240 has, and/or the diameter of the turns.

The balun 230c is capable of providing effective common-mode noise suppression within a very small area and without having to cut the cable 221c in order to install the balun 230c. While the inductor 240 is shown as having two layers 240a and 240b, it can have any number, M, of layers. As with the embodiment described above with reference to FIG. 4, a diamagnetic slug 234 made of a diamagnetic material (e.g., aluminum or copper) can be installed inside of the device 235 to alter the magnetic susceptibility of the cable 221c in the region of the inductor 240.

It should be noted that the present teachings have been described with reference to a few representative embodiments for the purpose of demonstrating the principles and concepts of the present teachings. Persons of skill in the art will understand how to modify the se embodiments consistent with the present teachings to achieve other embodiments not explicitly described herein. It should also be noted that the balun configurations described above with reference to FIGS. 3-5 are merely examples of suitable balun configurations that demonstrate the inventive principles and concepts. For example, the inductor 236 shown in FIGS. 3 and 4 could have M layers of windings similar to the inductor 240 shown in FIG. 5. Also the balun 230c shown in FIG. 5 could include a separate resonant circuit similar to the resonant circuit 237 shown in FIGS. 3 and 4, in which case the resonant circuit could be internal to or external to the device 235. As will be understood by those skilled in the art in view of the description being provided herein, many modifications may be made to the embodiments described herein while still achieving the goals of the present teachings, and all such modifications are within the scope of the invention. Also, the MRI system 100 shown in FIG. 1 and described herein is an example of an MRI system that can benefit from the use of the balun, but the invention is not limited to the balun being used in this particular MRI system.

What is claimed is:

1. A balun, comprising:
   a device made of a dielectric material, the device having an outer surface;
   a coaxial cable for a magnetic resonance imaging (MRI) system, the coaxial cable having a first end and a second end, a portion of the coaxial cable in between the first and second ends being wound L times about the outer surface to form a first inductor, where L is a positive integer that is greater than or equal to 1; and
   a resonant circuit having at least a second inductor and at least a first capacitor that are electrically coupled to one another, wherein the first inductor is configured to magnetically couples common-mode noise at a frequency of interest into the resonant circuit, the resonant circuit and the first inductor being configured to provide the coaxial cable with a coupled impedance, and wherein at the frequency of interest, the coupled impedance has a high value for suppressing common-mode signals propagating in the coaxial cable.

2. The balun of claim 1, wherein the device is at least partially hollow, and wherein the resonant circuit is disposed inside of the device.

3. The balun of claim 1, wherein the resonant circuit is disposed external to the device proximate the first inductor.

4. The balun of claim 3, further comprising:
   a diamagnetic slug, the diamagnetic slug being at least partially contained inside of the device.

5. The balun of claim 1, wherein the coaxial cable is configured for use in the MRI system to carry analog magnetic resonance (MR) signals from a radio frequency (RF) receive coil to an RF receiver.

6. The balun of claim 5, wherein the coaxial cable has a diameter that is less than or equal to one millimeter (mm).

7. A balun comprising:
   a device made of a dielectric material, the device having an outer surface;
   a coaxial cable for a magnetic resonance imaging (MRI) system, the coaxial cable having a first end and a second end, a portion of the coaxial cable in between the first and second ends being wound multiple times about the outer surface to form a first inductor layer and being wound multiple times about the first inductor layer to form a second inductor layer on top of the first inductor layer, the first and second inductor layers comprising a first inductor, and wherein a parasitic capacitance exists in between the windings, the parasitic capacitance and a first inductance of the first inductor being configured to provide a resonant circuit that has a parallel impedance at a frequency of interest for suppressing common-mode signals propagating in the coaxial cable.

8. The balun of claim 7, wherein the device is at least partially hollow and wherein the balun further comprises:
   a diamagnetic slug, the diamagnetic slug being at least partially contained inside of the device.

9. The balun of claim 7, wherein the coaxial cable is configured for use in the MRI system to carry analog magnetic resonance (MR) signals from a radio frequency (RF) receive coil to an RF receiver.

10. The balun of claim 9, wherein the coaxial cable has a diameter that is less than or equal to one millimeter (mm).

11. A magnetic resonance imaging (MRI) system comprising:
   N radio frequency (RF) receive coils, each RF receive coil being configured to detect an RF signal having a frequency of interest and to output a magnetic resonance (MR) signal, where N is a positive integer that is greater than or equal to one;
   N amplifiers, each amplifier configured to amplify an MR signal outputted by a respective RF receive coil to produce an amplified MR signal;
   at least one RF receiver; and
   a plurality of coaxial cables interconnecting outputs of the amplifiers with inputs of the RF receiver, wherein the amplified MR signals are carried on the coaxial cables from the outputs of the amplifiers to the inputs of the RF receiver, each coaxial cable having a balun comprising:
     a device made of a dielectric material, the device having an outer surface;
     a first inductor formed by winding a portion of the respective coaxial cable L times about the outer surface to form the first inductor, where L is a positive integer that is greater than or equal to 1; and
     a resonant circuit having at least a second inductor and at least a first capacitor that are electrically coupled to one another, wherein the first inductor is configured to magnetically couples common-mode noise at the frequency of interest into the resonant circuit, the resonant circuit and the first inductor configured to provide the coaxial cable with a coupled impedance, and wherein at the frequency of interest, the coupled impedance has a high value for suppressing common-mode signals propagating in the respective coaxial cable.

12. The MRI system of claim 11, wherein the device is at least partially hollow, and wherein the resonant circuit is disposed inside of the device.

13. The MRI system of claim 11, wherein the resonant circuit is disposed external to the device proximate the first inductor.

14. The MRI system of claim 13, further comprising:
a diamagnetic slug, the diamagnetic slug being at least partially contained inside of the device.

15. The MRI system of claim 11, wherein the coaxial cable has a diameter that is less than or equal to one millimeter (mm).

16. A magnetic resonance imaging (MRI) system comprising:
N radio frequency (RF) receive coils, each RF receive coil being configured to detect an RF signal having a frequency of interest and to output a magnetic resonance (MR) signal, where N is a positive integer that is greater than or equal to one;
N amplifiers, each amplifier amplifying an MR signal outputted by a respective RF receive coil to produce an amplified MR signal;
at least one RF receiver; and
a plurality of coaxial cables interconnecting outputs of the amplifiers with inputs of the RF receiver, wherein the amplified MR signals are carried on the coaxial cables from the outputs of the amplifiers to the inputs of the RF receiver, each coaxial cable having a balun comprising:
a device made of a dielectric material, the device having an outer surface; and
a first inductor formed by winding a portion of the respective coaxial cable multiple times about the outer surface to form a first inductor layer and winding the portion of the respective coaxial cable multiple times about the first inductor layer to form a second inductor layer on top of the first inductor layer, the first and second inductor layers comprising a first inductor, and wherein a parasitic capacitance exists in between the windings, the parasitic capacitance and a first inductance of the first inductor being configured to provide a resonant circuit that has a parallel impedance at the frequency of interest for suppressing common-mode signals propagating in the coaxial cable.

17. The MRI system of claim 16, wherein each balun further comprises: a diamagnetic slug, the diamagnetic slug being at least partially contained inside of the respective device.

18. The MRI system of claim 16, wherein the coaxial cable has a diameter that is less than or equal to one millimeter (mm).

* * * * *